United States Patent
Xu

(10) Patent No.: US 10,468,634 B2
(45) Date of Patent: Nov. 5, 2019

(54) OLED DISPLAY PANEL HAVING AN ELECTRO-POLARIZING LAYER

(71) Applicant: Wuhan China Star Optoelectronics Technology Co., Ltd., Wuhan (CN)

(72) Inventor: Kui Xu, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 38 days.

(21) Appl. No.: 15/566,707

(22) PCT Filed: Apr. 18, 2017

(86) PCT No.: PCT/CN2017/080951
§ 371 (c)(1),
(2) Date: Oct. 15, 2017

(87) PCT Pub. No.: WO2018/176517
PCT Pub. Date: Oct. 4, 2018

(65) Prior Publication Data
US 2019/0051864 A1 Feb. 14, 2019

(30) Foreign Application Priority Data
Mar. 29, 2017 (CN) .......................... 2017 1 0197432

(51) Int. Cl.
*H01L 29/08* (2006.01)
*H01L 33/00* (2010.01)
*H01L 31/0232* (2014.01)
*H01L 21/00* (2006.01)
*H01L 51/40* (2006.01)
(Continued)

(52) U.S. Cl.
CPC ....... *H01L 51/5281* (2013.01); *G09G 3/3208* (2013.01); *H01L 27/3232* (2013.01); *H01L 51/5253* (2013.01); *G09G 2360/142* (2013.01); *H01L 27/3227* (2013.01); *H01L 51/5012* (2013.01); *H01L 51/5056* (2013.01); *H01L 51/5072* (2013.01); *H01L 51/5088* (2013.01);
(Continued)

(58) Field of Classification Search
CPC .............. H01L 51/5281; H01L 51/5253; H01L 27/3227; H01L 27/323; G09G 3/3208
See application file for complete search history.

(56) References Cited

U.S. PATENT DOCUMENTS

| | | | | |
|---|---|---|---|---|
| 8,471,988 B2 * | 6/2013 | Shibata | ............. | G02F 1/136227 349/122 |
| 2003/0098856 A1 * | 5/2003 | Li | ..................... | G02F 1/133502 345/173 |

(Continued)

FOREIGN PATENT DOCUMENTS

| | | |
|---|---|---|
| CN | 103441139 | 12/2013 |
| CN | 103489891 | 1/2014 |
| CN | 103558708 | 2/2014 |

*Primary Examiner* — Alonzo Chambliss

(57) ABSTRACT

The present invention provides an OLED display panel and an OLED display apparatus. The OLED display panel includes a substrate, an OLED layer, an electro-polarizing layer, a light-sensing layer and a control chip. The OLED layer is mounted on the substrate. The electro-polarizing layer is mounted on the OLED layer and has a polarized state and a non-polarized state. The light-sensing layer is used to transfer an external light signal into an electric signal. The control chip is connected to the OLED layer, the electro-polarizing layer and the light-sensing layer.

15 Claims, 2 Drawing Sheets

(51) Int. Cl.
*H01L 51/52* (2006.01)
*G09G 3/3208* (2016.01)
*H01L 27/32* (2006.01)
*H01L 51/50* (2006.01)

(52) U.S. Cl.
CPC ...... *H01L 51/5206* (2013.01); *H01L 51/5221* (2013.01)

(56) References Cited

U.S. PATENT DOCUMENTS

| | | | |
|---|---|---|---|
| 2011/0018815 A1* | 1/2011 | Han | G06F 3/041 345/173 |
| 2013/0329288 A1 | 12/2013 | Yim et al. | |
| 2014/0152703 A1* | 6/2014 | Yang | G09G 5/10 345/690 |
| 2015/0049268 A1 | 2/2015 | Suzuki | |
| 2015/0303244 A1* | 10/2015 | de Jong | H01L 27/3227 257/40 |
| 2016/0149166 A1 | 5/2016 | Kwong | |

* cited by examiner

_US 10,468,634 B2_

OLED DISPLAY PANEL HAVING AN ELECTRO-POLARIZING LAYER

RELATED APPLICATIONS

This application is a National Phase of PCT Patent Application No. PCT/CN2017/080951 having International filing date of Apr. 18, 2017, which claims the benefit of priority of Chinese Patent Application No. 201710197432.X filed on Mar. 29, 2017. The contents of the above applications are all incorporated by reference as if fully set forth herein in their entirety.

BACKGROUND OF THE INVENTION

Filed and Background of the Invention

The present invention relates to the technical field of organic light emitting devices, and more particularly to an OLED display panel and an OLED display apparatus.

Description of the Related Art

At present, a mainstream technology in flat panel display industry is LCD (Liquid Crystal Display) and OLED (Organic Light-emitting Diode). An OLED display becomes gradually popular due to its characteristics, such as self-emission and high contrast ratio. However, it should be noticed that, because of the characteristic of luminous materials of OLED, there is still a great gap in the brightness and lifespan when compared with LCD. Especially when OLED is continuously emitting with high brightness, the increased decay of the luminous materials thereof will shorten the lifetime of the display device.

A conventional OLED display device generally has a polarizer attached to a top of an OLED layer to enhance its display effect. A basic structure of a conventional OLED display device is shown in FIG. 1 where an OLED layer 12 is mounted on a substrate 11, and a polarizer 13 is mounted on the top of the OLED layer 12, wherein "A" portion is the light emitted by the OLED layer itself, and "B" portion is the external light.

The polarizer 13 is optically designed to change the vector direction or rotation direction of the external light entering the OLED layer 12 to achieve an effect that the external light cannot go out once it enters. The biggest advantage of a polarizer is that the effective light emitted by the OLED is not subject to the interference of external light, the display screen is clear and bright, and the user experience is enhanced.

On the other hand, although the use of polarizers can effectively weaken the influence of external light and thus improve the quality, but the effective light emitted by the OLED will be reduced by 50% when passing through the polarizer, which is unfavorable for efficiently using the effective light emitted by the OLED.

Hence, it is necessary to provide an OLED display panel and an OLED display apparatus to overcome the foregoing technical problems.

SUMMARY OF THE INVENTION

The present invention provides an OLED display panel and an OLED display apparatus, wherein a light-sensing layer is mounted to convert external light signal into an electric signal, and a control chip controls the operating state of an OLED layer and an electro-polarizing layer based on a comparison result of the electric signal and a predetermined electric signal threshold value, so as to solve the problem of the conventional technology where the effective light emitted from the OLED is reduced due to that the conventional polarizer is always at a polarized state.

In order to solve the foregoing technical problem, the embodiment of the present invention provides an OLED display panel which includes:

a substrate;

an OLED layer mounted on the substrate, configured to display images according to a display signal, and having a first operating state and a second operating state;

an electro-polarizing layer mounted on the OLED layer and having a polarized state allowing light exiting in a preset polarization direction from the OLED layer to pass through and a non-polarized state allowing all light exiting from the OLED layer to pass through; the polarized state corresponds to the first operating state, and the non-polarized state corresponds to the second operating state;

a light-sensing layer configured to receive an external light signal and convert the external light signal into an electric signal;

a control chip being connected to the OLED layer, the electro-polarizing layer and the light-sensing layer, being configured to compare the electric signal with a predetermined electric signal threshold value, and controlling the operating state of the OLED layer and the electro-polarizing layer based on the comparison result; and a glass cover mounted on the light-sensing layer and being configured to protect the light-sensing layer;

for an identical displayed image, the emission brightness of the OLED layer in the second operating state is less than the emission brightness of the OLED layer in the first operating state;

when the value of the electric signal is greater than the electric signal threshold value, the electro-polarizing layer is in the polarized state, and the OLED layer is in the first operating state;

when the value of the electric signal is less than the electric signal threshold value, the electro-polarizing layer is in the non-polarized state, and the OLED layer is in the second operating state.

The embodiment of the present invention further provides an OLED display panel including:

a substrate;

an OLED layer mounted on the substrate, configured to display images according to a display signal, and having a first operating state and a second operating state;

an electro-polarizing layer mounted on the OLED layer and having a polarized state allowing light exiting in a preset polarization direction from the OLED layer to pass through and a non-polarized state allowing all light exiting from the OLED layer to pass through; the polarized state corresponds to the first operating state, and the non-polarized state corresponds to the second operating state;

a light-sensing layer configured to receive an external light signal and convert the external light signal into an electric signal;

a control chip being connected to the OLED layer, the electro-polarizing layer and the light-sensing layer, being configured to compare the electric signal with a predetermined electric signal threshold value, and controlling the operating state of the OLED layer and the electro-polarizing layer based on the comparison result;

for an identical displayed image, the emission brightness of the OLED layer in the second operating state is less than the emission brightness of the OLED layer in the first operating state.

In the OLED display panel of the present invention, when the value of the electric signal is greater than the electric signal threshold value, the electro-polarizing layer is in the polarized state, and the OLED layer is in the first operating state;

when the value of the electric signal is less than the electric signal threshold value, the electro-polarizing layer is in the non-polarized state, and the OLED layer is in the second operating state.

In the OLED display panel of the present invention, the OLED display panel further includes a glass cover that is mounted on the light-sensing layer and is configured to protect the light-sensing layer.

In the OLED display panel of the present invention, the glass cover is a high transmittance glass cover.

In the OLED display panel of the present invention, the OLED layer includes:

an anode mounted on the substrate and configured to generate holes under an action of a driving voltage;

a hole injection layer mounted on the anode and configured to inject the holes to an organic light-emitting layer;

a hole transport layer mounted on the hole injection layer and configured to transport the holes injected by the hole injection layer to the organic light-emitting layer;

the organic light-emitting layer being mounted on the hole transport layer and configured to combine the holes with electrons transported by an electron transport layer to form light;

the electron transport layer being mounted on the organic light-emitting layer and configured to transport electrons injected by a cathode to the organic light-emitting layer; and the cathode configured to generate the electrons under an action of the driving voltage.

In the OLED display panel of the present invention, when two sides of the electro-polarizing layer is applied with a driving voltage, the electro-polarized layer is in the polarized state; when two sides of the electro-polarizing layer is not applied with the driving voltage, the electro-polarized layer is in the non-polarized state.

In the OLED display panel of the present invention, the electro-polarizing layer is mounted on the OLED layer by vacuum laminating or chemical vapor deposition.

In the OLED display panel of the present invention, the light-sensing layer is mounted on the electro-polarizing layer by vacuum laminating or chemical vapor deposition.

An OLED display apparatus having an OLED display panel, a driving circuit and an external frame, wherein the OLED display panel includes:

a substrate;

an OLED layer mounted on the substrate, configured to display images according to a display signal, and having a first operating state and a second operating state;

an electro-polarizing layer mounted on the OLED layer and having a polarized state allowing light exiting in a preset polarization direction from the OLED layer to pass through and a non-polarized state allowing all light exiting from the OLED layer to pass through; the polarized state corresponds to the first operating state, and the non-polarized state corresponds to the second operating state;

a light-sensing layer configured to receive an external light signal and convert the external light signal into an electric signal;

a control chip being connected to the OLED layer, the electro-polarizing layer and the light-sensing layer, being configured to compare the electric signal with a predetermined electric signal threshold value, and controlling the operating state of the OLED layer and the electro-polarizing layer based on the comparison result;

for an identical displayed image, the emission brightness of the OLED layer in the second operating state is less than the emission brightness of the OLED layer in the first operating state.

In the OLED display apparatus of the present invention, when the value of the electric signal is greater than the electric signal threshold value, the electro-polarizing layer is in the polarized state, and the OLED layer is in the first operating state;

when the value of the electric signal is less than the electric signal threshold value, the electro-polarizing layer is in the non-polarized state, and the OLED layer is in the second operating state.

In the OLED display apparatus of the present invention, the OLED display panel further includes a glass cover that is mounted on the light-sensing layer and is configured to protect the light-sensing layer.

In the OLED display apparatus of the present invention, the glass cover is a high transmittance glass cover.

In the OLED display apparatus of the present invention, the OLED layer includes:

an anode mounted on the substrate and configured to generate holes under an action of a driving voltage;

a hole injection layer mounted on the anode and configured to inject the holes to an organic light-emitting layer;

a hole transport layer mounted on the hole injection layer and configured to transport the holes injected by the hole injection layer to the organic light-emitting layer;

the organic light-emitting layer being mounted on the hole transport layer and configured to combine the holes with electrons transported by an electron transport layer to form light;

the electron transport layer being mounted on the organic light-emitting layer and configured to transport electrons injected by a cathode to the organic light-emitting layer; and the cathode configured to generate the electrons under an action of the driving voltage.

In the OLED display apparatus of the present invention, when two sides of the electro-polarizing layer is applied with a driving voltage, the electro-polarized layer is in the polarized state; when two sides of the electro-polarizing layer is not applied with the driving voltage, the electro-polarized layer is in the non-polarized state.

In the OLED display apparatus of the present invention, the electro-polarizing layer is mounted on the OLED layer by vacuum laminating or chemical vapor deposition.

In the OLED display apparatus of the present invention, the light-sensing layer is mounted on the electro-polarizing layer by vacuum laminating or chemical vapor deposition.

Compared with the conventional technology, the advantages of the present invention are: the OLED display panel and the OLED display apparatus of the present invention use a light-sensing layer which is mounted to convert external light signal into an electric signal and a control chip which controls the operating state of an OLED layer and an electro-polarizing layer based on a comparison result of the electric signal and a predetermined electric signal threshold value, so that the electro-polarizing layer will only be switched to a polarized state when polarization is needed. Thus, at the non-polarized state, the light-emitting efficiency of the OLED layer is greater where only a little brightness for the same display image is required, thereby extending the lifespan of the OLED layer.

In order to make the contents of the present invention more easily understood, the preferred embodiments of the present invention are described in detail, in cooperation with accompanying drawings, as follows.

DESCRIPTION OF SPECIFIC EMBODIMENTS OF THE INVENTION

In order to explain the technical solutions in the present embodiments or in the prior art more clearly, accompanying drawings required in the description of the present embodiments or prior art will be briefly described. Obviously, accompanying drawings are just some embodiments of the present disclosure, while other drawings may be obtained by those skilled in the art according to these drawings, without paying out any creative work.

A polarizer is optically designed to change the vector direction or rotation direction of external light entering an OLED layer to achieve an effect that the external light cannot go out once it enters. The biggest advantage of a polarizer is that the effective light emitted by the OLED layer is not subject to the interference of external natural light, the display screen is clear and bright, and user experience is enhanced.

Although the use of polarizers can effectively weaken the influence of external light and thus improve the quality, but the energy of the effective light emitted by the OLED layer will be reduced by 50% when passing through the polarizer, which is unfavorable for efficiently using the effective light emitted by the OLED.

The following is a preferred embodiment of the OLED display panel and an OLED display apparatus provided by the present invention capable of solving the foregoing technical problem.

Figure 1:
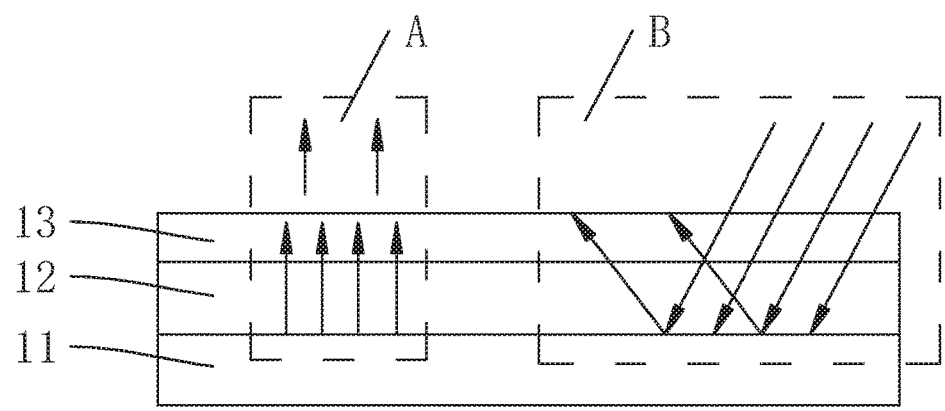
FIG. 1 is a schematic diagram of a conventional OLED display panel.
Figure 2:
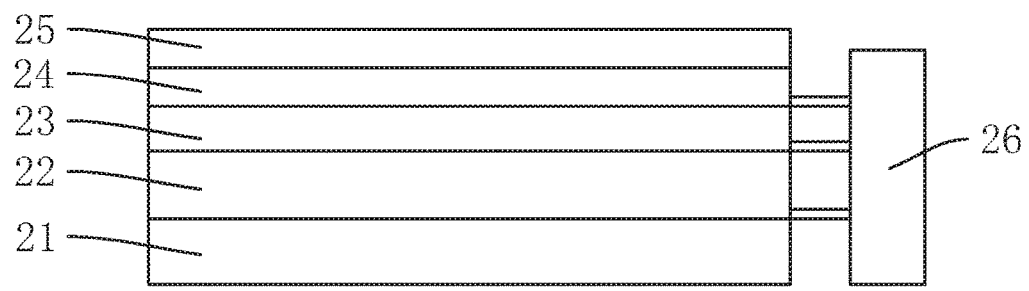
FIG. 2 is a schematic diagram of an OLED display panel and an OLED display apparatus according to a preferred embodiment of the present invention.

With reference to FIG. 2, FIG. 2 is a schematic diagram of an OLED display panel and an OLED display apparatus according to a preferred embodiment of the present invention.

In the drawings, similar structural units are designated by the same reference numerals.

The orientations mentioned hereinafter are based on "light emitting direction", a side facing a light-emitting surface is called "a top", a side opposite to the light-emitting surface is called "a bottom".

The preferred embodiment of the OLED display panel and the OLED display apparatus provided by the present invention is: an OLED display panel includes:

a substrate 21:

an OLED layer 22 being mounted on the substrate 21 and being configured to display images according to a display signal, and having a first operating state and a second operating state;

an electro-polarizing layer 23 being mounted on the OLED layer 22 and having a polarized state allowing light exiting in a preset polarization direction from the OLED layer 22 to pass through and a non-polarized state allowing all light exiting from the OLED layer 22 to pass through; the polarized state corresponds to the first operating state, and the non-polarized state corresponds to the second operating state;

a light-sensing layer 24 being mounted on the electro-polarizing layer 23 and configured to receive an external light signal and covert the external light signal into an electric signal;

a glass cover 25 being a high transmittance glass cover, being mounted on the light-sensing layer 24, and being configured to protect the light-sensing layer 24;

a control chip 26 being connected to the OLED layer 22, the electro-polarizing layer 23 and the light-sensing layer 24, being configured to compare the electric signal with a predetermined electric signal threshold value, and controlling the operating state of the OLED layer 22 and the operating state of the electro-polarizing layer 23 based on the comparison result;

since the second operating state corresponds to the non-polarized state, and the electro-polarizing layer 23 in the non-polarized state does not decrease the effective light emitted by the OLED layer 22, the needed emission brightness of the OLED layer in the second operating state can be less than the needed emission brightness of the OLED layer 22 in the first operating state for displaying an identical image; wherein it should be noticed that the so-called identical image means that the image displayed by the OLED display panel (or the OLED display apparatus) of the present invention and finally seen by the user is displayed with the same parameters in graphics, color, and brightness.

In this preferred embodiment, when the value of the electric signal is greater than the electric signal threshold value, the electro-polarizing layer 23 is in the polarized state, and the OLED layer 22 is in the first operating state.

When the value of the electric signal is less than the electric signal threshold value, the electro-polarizing layer 23 is in the non-polarized state, and the OLED layer 22 is in the second operating state.

The OLED layer 22 includes:

an anode;

a hole injection layer mounted on the anode and configured to inject the holes to an organic light-emitting layer;

a hole transport layer mounted on the hole injection layer and configured to transport the holes injected by the hole injection layer to the organic light-emitting layer;

the organic light-emitting layer being mounted on the hole transport layer and configured to combine the holes with electrons transported by an electron transport layer to form light;

the electron transport layer being mounted on the organic light-emitting layer and configured to transport electrons injected by a cathode to the organic light-emitting layer; and the cathode being configured to generate the electrons under an action of the driving voltage.

Figure 3:
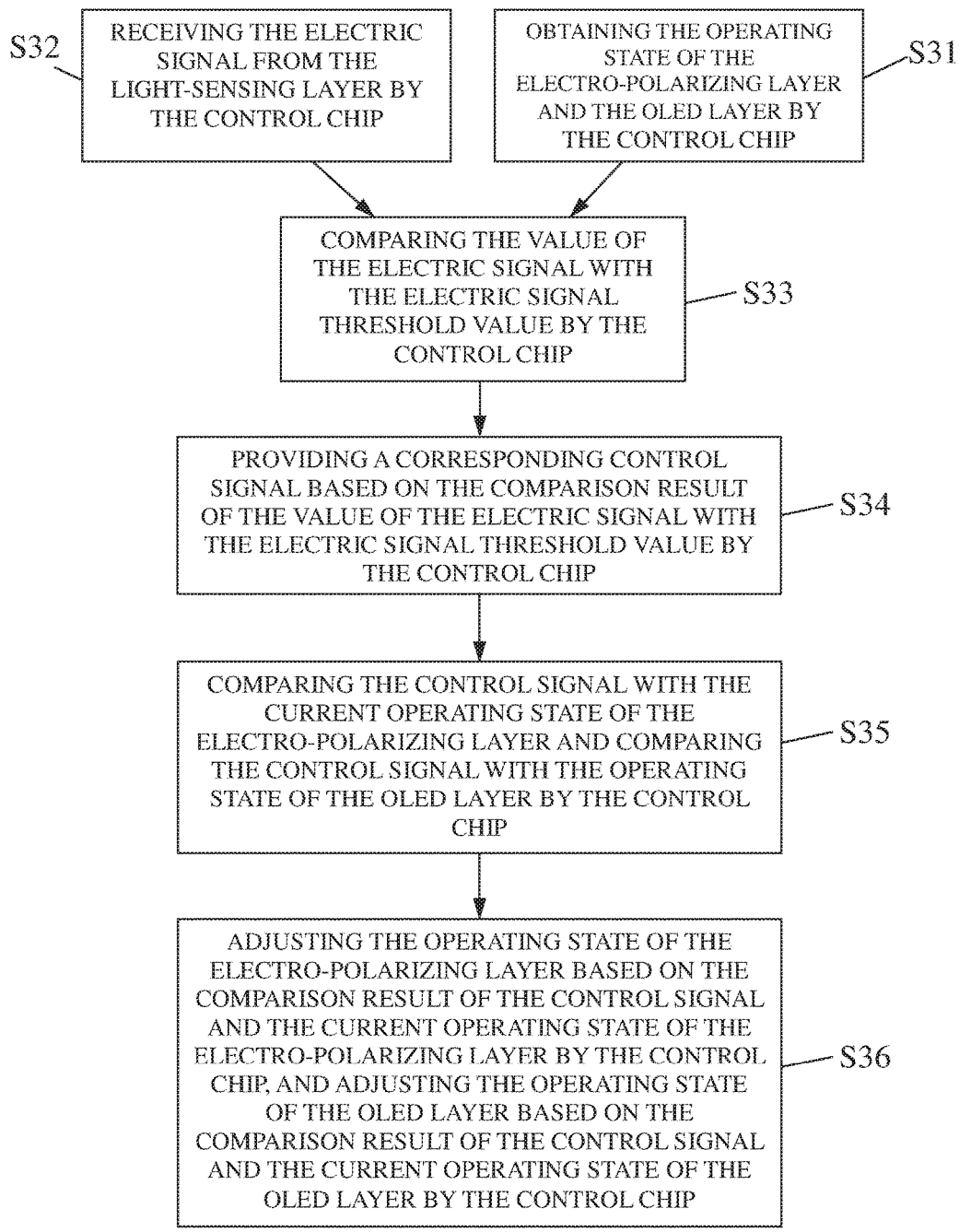
FIG. 3 is a flowchart of operating states of an electro-polarizing layer and OLEDs controlled by a control chip of the OLED display panel and the OLED display apparatus of the present invention.

With reference to FIG. 3, FIG. 3 is a flowchart of steps of operating states of an electro-polarizing layer and an OLED layer controlled by a control chip of the OLED display panel and the OLED display apparatus of the present invention.

In the present invention, steps of determining the operating state of the electro-polarizing layer 23 and the operating state of the OLED layer 22 based on the predetermined electric signal threshold value and the electric signal includes:

Step S31: the control chip 26 obtains the operating state of the electro-polarizing layer 23 and the operating state of the OLED layer 22;

Step S32: the control chip 26 receives the electric signal from the light-sensing layer 24;

Step S33: the control chip 26 compares the value of the electric signal with the electric signal threshold value;

Step S34: the control chip 26 provides a corresponding control signal based on the comparison result of the value of the electric signal with the electric signal threshold value;

Step S35: the control chip 26 compares the control signal with the current operating state of the electro-polarizing layer 23, and the control chip 26 compares the control signal with the operating state of the OLED layer 22;

Step S36: the control chip 26 adjusts the operating state of the electro-polarizing layer 23 based on the comparison result of the control signal and the current operating state of the electro-polarizing layer 23, and the control chip 26 adjusts the operating state of the OLED layer 22 based on the comparison result of the control signal and the current operating state of the OLED layer 22.

Furthermore, in the step S34 where the control chip 26 provides a corresponding control signal based on the comparison result of the value of the electric signal with the electric signal threshold value, it is specifically implemented as the followings:

the control chip 26 determines if the value of the electric signal is greater than the electric signal threshold value; if the value of the electric signal is greater than the electric signal threshold value, the control chip 26 will provide a polarizer-activated signal which corresponds to the polarized state of the electro-polarizing layer 23 and the first operating state of the OLED layer 22;

if the value of the electric signal is smaller than the electric signal threshold value, the control chip 26 will provide a polarizer-deactivated signal which corresponds to the non-polarized state of the electro-polarizing layer 23 and the second operating state of the OLED layer 22.

Furthermore, in the step S36 where the control chip 26 adjusts the operating state of the electro-polarizing layer 23 based on the comparison result of the control signal and the current operating state of the electro-polarizing layer 23, and the control chip 26 adjusts the operating state of the OLED layer 22 based on the comparison result of the control signal and the current operating state of the OLED layer 22, it is specifically implemented as the followings:

when the electro-polarizing layer 23 is in the polarized state and the control signal is the polarizer-activated signal, the electro-polarizing layer 23 remains in the polarized state;

when the electro-polarizing layer 23 is in the non-polarized state and the control signal is the polarizer-deactivated signal, the electro-polarizing layer 23 remains in the non-polarized state;

when the electro-polarizing layer 23 is in the polarized state and the control signal is the polarizer-deactivated signal, the electro-polarizing layer 23 turns to be in the non-polarized state;

when the electro-polarizing layer 23 is in the non-polarized state and the control signal is the polarizer-activated signal, the electro-polarizing layer 23 turns to be in the polarized state;

when the OLED layer 22 is in the first operating state and the control signal is the polarizer-activated signal, the OLED layer 22 remains in the first operating state;

when the OLED layer 22 is in the second operating state and the control signal is the polarizer-deactivated signal, the OLED layer 22 remains in the second operating state;

when the OLED layer 22 is in the first operating state and the control signal is the polarizer-deactivated signal, the OLED layer 22 turns to be in the second operating state;

when the OLED layer 22 is in the second operating state and the control signal is the polarizer-activated signal, the OLED layer 22 turns to be in the first operating state.

In the preferred embodiment, the electro-polarizing layer 23 is mounted on the OLED layer 22 by vacuum laminating or chemical vapor deposition.

In the preferred embodiment, the light-sensing layer 24 is mounted on the electro-polarizing layer 23 by vacuum laminating or chemical vapor deposition.

The present invention further includes an OLED display apparatus which includes an OLED display panel, a driving circuit and an external frame. The OLED display panel includes:

a substrate 21;

an OLED layer 22 being mounted on the substrate 21 and being configured to display images according to a display signal, and having a first operating state and a second operating state;

an electro-polarizing layer 23 being mounted on the OLED layer 22 and having a polarized state allowing light exiting in a preset polarization direction from the OLED layer 22 to pass through and a non-polarized state allowing all light exiting from the OLED layer 22 to pass through; the polarized state corresponds to the first operating state, and the non-polarized state corresponds to the second operating state;

a light-sensing layer 24 being configured to receive an external light signal and covert the external light signal into an electric signal;

a control chip 26 being connected to the OLED layer 22, the electro-polarizing layer 23 and the light-sensing layer 24, being configured to compare the electric signal with a predetermined electric signal threshold value, and controlling the operating state of the OLED layer 22 and the operating state of the electro-polarizing layer 23 based on the comparison result;

the needed emission brightness of the OLED layer 22 in the second operating state is less than the needed emission brightness of the OLED layer 22 in the first operating state for displaying an identical image.

In the OLED display apparatus of the preferred embodiment, when the value of the electric signal is greater than the electric signal threshold value, the electro-polarizing layer 23 is in the polarized state, and the OLED layer 22 is in the first operating state;

when the value of the electric signal is less than the electric signal threshold value, the electro-polarizing layer 23 is in the non-polarized state, and the OLED layer 22 is in the second operating state.

The working principle of the invention is that: when the OLED display terminal is in an environment with a high external light intensity, such external light intensity is generally higher than or even way higher than the highest brightness of the OLED display, and will cause a great influence on the display effect of the OLED display. Thus, in this case it generally needs a polarizer to enhance the display effect to make the effective light emitted by the OLED not to be interfered by the external natural light, and to display a clear and bright image;

when the OLED display terminal is in an environment with a lower external light intensity, such external light intensity is generally lower than or even way lower than the lowest brightness of the OLED display, and will cause little influence on the display effect of the OLED display. However, the polarizer of the OLED display terminal of the conventional technology is always in a polarized state where the effect on the external light with such lower light intensity is not large, but the block on the effective light emitted by the OLED is more obvious, therefore the OLED needs to provide a higher luminous intensity to display the same image.

The light-sensing layer 24 of the OLED display panel and the OLED display apparatus of the preferred embodiment can convert slight signals having different luminous intensity into corresponding electric signals, and uses a predetermined electric signal threshold value to distinguish the level of external light intensity;

Firstly, the control chip 26 receives the electric signal from the light-sensing layer 24 and the operating state information of the electro-polarizing layer 23 and the OLED layer 22;

then the control chip 26 compares the electric signal with the electric signal threshold value, wherein the comparison result of the electric signal and the electric signal threshold value corresponds to a certain level of external light intensity; the control chip 26 then provides a corresponding control signal based on the comparison result of the electric signal and the electric signal threshold value;

the control chip 26 compares the control signal with the current operating state of the electro-polarizing layer 23, and compares the control signal with the current operating state of the OLED layer 22;

if the current operating state of the electro-polarizing layer 23 is identical to the operating state to which the control signal corresponds, the electro-polarizing layer 23 then remains in the current operating state;

if the current operating state of the electro-polarizing layer 23 is not identical to the operating state to which the control signal corresponds, the electro-polarizing layer 23 then turns to be in the operating state that is identical to the operating state to which the control signal corresponds;

if the current operating state of the OLED layer 22 is identical to the operating state to which the control signal corresponds, the OLED layer 22 then remains in the current operating state;

if the current operating state of the OLED layer 22 is not identical to the operating state to which the control signal corresponds, the OLED layer 22 then turns to be in the operating state that is identical to the operating state to which the control signal corresponds.

When the OLED display panel and the OLED display apparatus of the preferred embodiment is in an environment with a high external light intensity, the electro-polarizing layer 23 is in the polarized state, and the effective light emitted from the OLED layer 22 having higher luminous intensity or the OLED layer 22 having lower luminous intensity will be reduced by about 50% after passing through the electro-polarizing layer 23;

when the OLED display panel and the OLED display apparatus of the preferred embodiment is in an environment with a low external light intensity, the electro-polarizing layer 23 is in the non-polarized state, and the effective light emitted from the OLED layer 22 having higher luminous intensity or the OLED layer 22 having lower luminous intensity will basically all pass through the electro-polarizing layer 23.

This completes the process of the control chip of the OLED display panel and the OLED display apparatus of the preferred embodiment controlling the electro-polarizing layer and the operating state of the OLED layer according to the light intensity.

The OLED display panel and the OLED display apparatus of the present invention use a light-sensing layer which is mounted to convert external light signal into an electric signal and a control chip which controls the operating state of an OLED layer and an electro-polarizing layer based on a comparison result of the electric signal and a predetermined electric signal threshold value, so that the electro-polarizing layer will only be switched to a polarized state when polarization is needed. Thus, at the non-polarized state, the light-emitting efficiency of the OLED layer is greater where only a little brightness for the same display image is required, thereby extending the lifespan of the OLED layer.

In conclusion, although the present invention has been described with reference to the preferred embodiment thereof, it is apparent to those skilled in the art that a variety of modifications and changes may be made without departing from the scope of the present invention which is intended to be defined by the appended claims.

What is claimed is:

1. An OLED display panel, comprising:

a substrate;

an OLED layer mounted on the substrate, configured to display images according to a display signal, and having a first operating state and a second operating state;

an electro-polarizing layer mounted on the OLED layer and having a polarized state allowing light exiting in a preset polarization direction from the OLED layer to pass through and a non-polarized state allowing all light exiting from the OLED layer to pass through; the polarized state corresponds to the first operating state, and the non-polarized state corresponds to the second operating state;

a light-sensing layer mounted on the electro-polarizing layer and configured to receive an external light signal and convert the external light signal into an electric signal;

a control chip being connected to the OLED layer, the electro-polarizing layer and the light-sensing layer, being configured to compare the electric signal with a predetermined electric signal threshold value, and controlling the operating state of the OLED layer and the electro-polarizing layer based on the comparison result; and a glass cover mounted on the light-sensing layer and being configured to protect the light-sensing layer;

for an identical displayed image, the emission brightness of the OLED layer in the second operating state is less than the emission brightness of the OLED layer in the first operating state;

when the value of the electric signal is greater than the electric signal threshold value, the electro-polarizing layer is in the polarized state, and the OLED layer is in the first operating state;

when the value of the electric signal is less than the electric signal threshold value, the electro-polarizing layer is in the non-polarized state, and the OLED layer is in the second operating state.

2. An OLED display panel, comprising:

a substrate;

an OLED layer mounted on the substrate, configured to display images according to a display signal, and having a first operating state and a second operating state;

an electro-polarizing layer mounted on the OLED layer and having a polarized state allowing light exiting in a preset polarization direction from the OLED layer to pass through and a non-polarized state allowing all light exiting from the OLED layer to pass through; the polarized state corresponds to the first operating state, and the non-polarized state corresponds to the second operating state;

a light-sensing layer mounted on the electro-polarizing layer and configured to receive an external light signal and convert the external light signal into an electric signal;

a control chip being connected to the OLED layer, the electro-polarizing layer and the light-sensing layer, being configured to compare the electric signal with a predetermined electric signal threshold value, and controlling the operating state of the OLED layer and the electro-polarizing layer based on the comparison result;

for an identical displayed image, the emission brightness of the OLED layer in the second operating state is less than the emission brightness of the OLED layer in the first operating state.

3. The OLED display panel as claimed in claim 2, wherein when the value of the electric signal is greater than the electric signal threshold value, the electro-polarizing layer is in the polarized state, and the OLED layer is in the first operating state;

when the value of the electric signal is less than the electric signal threshold value, the electro-polarizing layer is in the non-polarized state, and the OLED layer is in the second operating state.

4. The OLED display panel as claimed in claim 2, wherein the OLED display panel further includes a glass cover that is mounted on the light-sensing layer and is configured to protect the light-sensing layer.

5. The OLED display panel as claimed in claim 4, wherein the glass cover is a high transmittance glass cover.

6. The OLED display panel as claimed in claim 2, wherein when two sides of the electro-polarizing layer is applied with a driving voltage, the electro-polarized layer is in the polarized state; when two sides of the electro-polarizing layer is not applied with a driving voltage, the electro-polarized layer is in the non-polarized state.

7. The OLED display panel as claimed in claim 2, wherein the electro-polarizing layer is mounted on the OLED layer by vacuum laminating or chemical vapor deposition.

8. The OLED display panel as claimed in claim 2, wherein the light-sensing layer is mounted on the electro-polarizing layer by vacuum laminating or chemical vapor deposition.

9. An OLED display apparatus, comprising an OLED display panel, a driving circuit and an external frame, wherein the OLED display panel includes:

a substrate;

an OLED layer mounted on the substrate, configured to display images according to a display signal, and having a first operating state and a second operating state;

an electro-polarizing layer mounted on the OLED layer and having a polarized state allowing light exiting in a preset polarization direction from the OLED layer to pass through and a non-polarized state allowing all light exiting from the OLED layer to pass through; the polarized state corresponds to the first operating state, and the non-polarized state corresponds to the second operating state;

a light-sensing layer mounted on the electro-polarizing layer and configured to receive an external light signal and convert the external light signal into an electric signal; and a control chip being connected to the OLED layer, the electro-polarizing layer and the light-sensing layer, being configured to compare the electric signal with a predetermined electric signal threshold value, and controlling the operating state of the OLED layer and the electro-polarizing layer based on the comparison result;

for an identical displayed image, the emission brightness of the OLED layer in the second operating state is less than the emission brightness of the OLED layer in the first operating state.

10. The OLED display apparatus as claimed in claim 9, wherein when the value of the electric signal is greater than the electric signal threshold value, the electro-polarizing layer is in the polarized state, and the OLED layer is in the first operating state;

when the value of the electric signal is less than the electric signal threshold value, the electro-polarizing layer is in the non-polarized state, and the OLED layer is in the second operating state.

11. The OLED display apparatus as claimed in claim 9, wherein the OLED display panel further includes a glass cover that is mounted on the light-sensing layer and is configured to protect the light-sensing layer.

12. The OLED display apparatus as claimed in claim 11, wherein the glass cover is a high transmittance glass cover.

13. The OLED display apparatus as claimed in claim 9, wherein when two sides of the electro-polarizing layer is applied with a driving voltage, the electro-polarized layer is in the polarized state; when two sides of the electro-polarizing layer is not applied with the driving voltage, the electro-polarized layer is in the non-polarized state.

14. The OLED display apparatus as claimed in claim 9, wherein the electro-polarizing layer is mounted on the OLED layer by vacuum laminating or chemical vapor deposition.

15. The OLED display apparatus as claimed in claim 9, wherein the light-sensing layer is mounted on the electro-polarizing layer by vacuum laminating or chemical vapor deposition.

* * * * *